United States Patent [19]

Larsen et al.

[11] Patent Number: 4,679,178

[45] Date of Patent: Jul. 7, 1987

[54] ARRANGEMENT IN HYDROPHONE

[75] Inventors: Eigil Larsen, Horten; Eldar Lien, Kjolsdalen, both of Norway; Clive Snook, Oegstgeest, Netherlands

[73] Assignee: Geophysical Company of Norway A.S., Hovik, Norway

[21] Appl. No.: 777,673

[22] Filed: Sep. 19, 1985

[30] Foreign Application Priority Data

Sep. 19, 1984 [NO] Norway ................................ 843743

[51] Int. Cl.[4] ...................... H04R 17/00; H01L 41/04; H01L 41/08; H01L 41/18

[52] U.S. Cl. .................................... 367/157; 367/155; 367/160; 367/163; 367/174; 310/331; 310/337

[58] Field of Search ............... 310/334, 337, 348, 351, 310/352, 353, 358, 369, 331; 367/140, 141, 155, 157, 158, 159, 160, 161, 162, 163, 165, 167, 173, 174, 176, 180, 188

[56] References Cited

U.S. PATENT DOCUMENTS

| | | | |
|---|---|---|---|
| 3,255,431 | 6/1966 | Howatt | 367/160 |
| 3,660,809 | 5/1972 | Pearson | 367/152 |
| 3,832,762 | 9/1974 | Johnston et al. | 29/25.35 |
| 3,970,878 | 7/1976 | Berglund | 32/337 |
| 4,336,639 | 6/1982 | Berglund | 29/25.35 |
| 4,517,664 | 11/1981 | Berglund | 367/163 |

*Primary Examiner*—Deborah L. Kyle
*Assistant Examiner*—Brian S. Steinberger
*Attorney, Agent, or Firm*—Holman & Stern

[57] ABSTRACT

An arrangement in a piezoelectric hydrophone that is provided with a protective outer housing enveloping a waterproof closed casing (2). Said casing is provided with two mutually opposed and parallel diaphragm wafers (3) on the insides of which piezoelectric crystals (4) being metal coated on their outsides are respectively attached. A connecting wire is extended from said case through its hollow central portion (6). Said central portion (6) is formed by at least two ceramic elements (7) joined along a plane parallel with the diaphragm wafers and provided with a metalization (11) in the mutual contact areas (9, 10). In the cavities (12) respectively of the two elements (7) stiffening ceramic disks (8) are provided and attached to the elements (7) by the aid of a matching projection (13). The inward facing poles of the piezoelectric crystals are conductively connected with the metalization in the contact plane of the elements, and an additional wire (5) is provided from the metalization (11) on the outside. The poles facing outward of said crystals are connected via said diaphragm wafers (3) on the outside of the casing (2). The ceramic material used is $Al_2O_3$ having a degree of purity of more than 85%.

7 Claims, 2 Drawing Figures

ARRANGEMENT IN HYDROPHONE

BACKGROUND OF THE INVENTION

1. Field of the Invention

The present invention relates to an arrangement of a piezoelectric hydrophone having a protective outer housing in which a water-proof closed casing is provided comprising two opposed and parallel diaphragm wafers which are both on their inner surfaces provided with piezoelectric crystals having metal coated surfaces, and where connecting wires extend from said casing through its hollow central part.

2. Prior Art Statement

The structure of hydrophones based on the above principle is known per se, and structures of this kind are disclosed, inter alia, in U.S. Pat. No. 3,255,431 and U.S. Pat. No. 3,970,878. The first mentioned specification discloses a design comprising an annular support member with a planar diaphragm element and a piezoelectric element provided on each side. In principle, the piezoelectric element may be provided inside and outside said diaphragm member. From said elements electric wires are extended, and the entire structure is provided in a case.

Another hydrophone embodiment, in principle using the same structure, is disclosed in U.S. Pat. No. 3,970,878. It is a major object of this patent to make the hydrophone element per se tight to prevent liquid/water from entering into the element and, thus, from contact with the piezoelectric crystals. The main embodiment in this respect is a structure, wherein the casing comprises two metal halves that are soldered together about a flange and wherein the electrical terminals extend through insulating glass members. In a special embodiment the central portion of the case is entirely manufactured from glass that is glued or bonded in any desired manner to the diaphragm wafers forming the side walls of the case. In such an embodiment sealing problems may arise at the joint edges.

Hydrophones of this kind are frequently used as receiver means in seismic explorations. For marine explorations a socalled "streamer" is provided having hydrophones placed inside a cable that may be filled with a special liquid, e.g. kerosene, or the hydrophones may be immediately exposed to sea water. Obviously, it is essential to prevent the piezoelectric crystal element from being exposed to the influence of the surrounding liquid. The hydrophone according to U.S. Pat. No. 3,255,431 does not comply with these requirements since, among others, leakage problems would arise in connection with the terminals. Special consideration was devoted to this problem in U.S. Pat. No. 3,970,878. The possibility of safeguarding the hydrophone against overpressure was discussed and the possibility of providing a spacer or a stiffening element inside the hydrophone casing was disclosed.

Recent development, however, requires higher hydrophone quality due to, among others, the development of digital streamer systems for utilization in seismic marine explorations. Such hydrophones should have an accuracy of approximately 2% with respect to the voltage and charging sensitivity against 5% previously in order to achieve a maximum data quality before the data reduction occurring in connection with the summation of the single hydrophones of an array.

Also, large numbers of such hydrohones are used in seismic explorations, and thus, it is essential that the cost of these products is kept as low as possible. Additionally, it is important that they are dependable.

SUMMARY OF THE INVENTION

It is an object of the present invention to provide a hydrophone structure that is simple and inexpensive in production, dependable in operation, and has a casing that is completely sealed against its surroundings and ensures the best possible sensitivity. The hydrophone should also be able to withstand great static pressure.

These objects are achieved by a hydrophone that is characterized as stated in the claims.

In developing the hydrophone according to the invention the present development of the digital technique and the miniaturisation of components was also considered. The hydrophone according to the invention is thus designed for enabling the provision of electrical components with signal amplification or signal processing functions inside the hydrophone. It will then be possible to assemble a plurality of matched elements, or carry out adjustments and tuning of the individual hydrophones to match them in a streamer array.

The design of the hydrophones according to the present invention also enables testing before completion. Hydrophone reliability can thus be controlled.

BRIEF DESCRIPTION OF THE DRAWINGS

The invention will now be illustrated by an embodiment shown in the drawings, wherein.

DETAILED DESCRIPTION OF THE DRAWINGS

Figure 1:
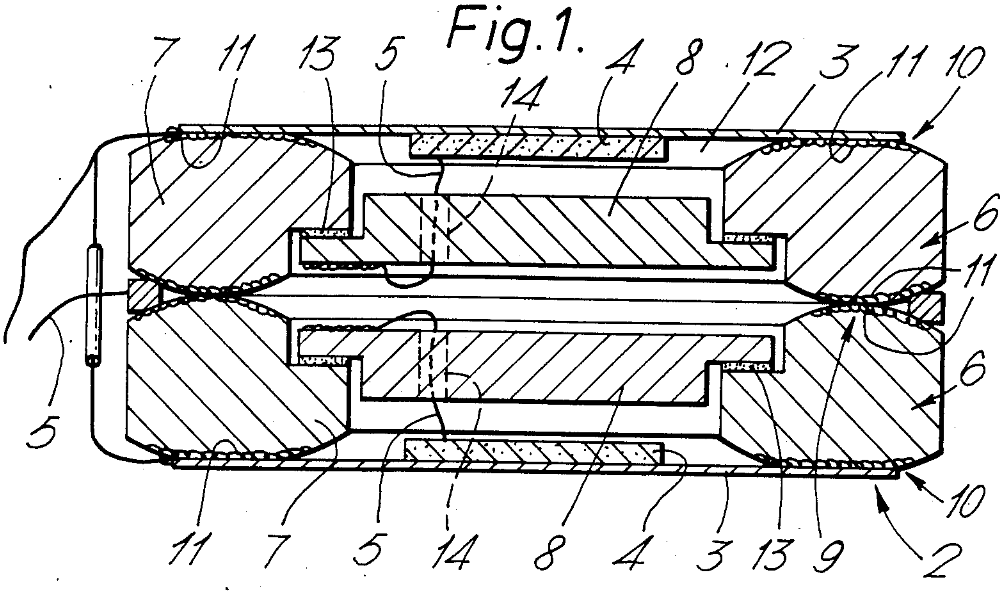
FIG. 1 shows a hydrophone according to the invention in section, the protective outer housing being removed.

The hydrophone according to the invention comprises an outer housing 1 (FIG. 2), which may advantageously be a brass housing. The function of said housing 1 is to protect the hydrophone against external mechanic influences and to simplify hydrophone positioning as well as providing a fixation of the terminals, i.e. the wiring as disclosed in more detail below. The active hydrophone element comprises a sealed casing that is impermeable to liquid and is generally designated 2 in FIGS. 1 and 2. In the shown embodiment said casing has a circular-cylindric shape. Said casing 2 is inserted in said hydrophone housing 1 which for this purpose has an elliptic cross section and a cylinder length to enable insertion of the entire casing 2 inside the housing 1. The casing 2 is simply wedged into the housing 1 being contacted with flexible plastic packings that are glued to the inner surface of the housing 1. This holding plastic element may e.g. be manufactured from "Hytrell" having a thickness of 1 mm. The hydrophone element is thus kept in place by frictional forces. Positioning and holding the casing member 2 is thus very simple.

The casing 2 consists of two outer diaphragm wafers being cylindrical in the shown embodiment and made of beryllium copper. It is well-known in the art to use such a material. Between said two diaphragm wafers 3 a ceramic insulant in the shape of an annular member, the structure of which is disclosed in more detail below, is provided. The central portion 6 is made of alumina, $Al_2O_3$, having a high degree of purity. The material is preferably an alumina burnt at 1800° C. resulting in a purity of more than 85%, preferably of 96%. The material is a so called thick film quality and provides a possibility of obtaining a good metalization of the surface.

To the inner surface of the diaphragm wafers 3 piezoelectric conductive crystal elements are attached by the aid of an electrically conductive glue and provided with silver electrodes or pole faces towards said diaphragm wafer and on the opposite face.

Inside the cavity of the central ring portion 6 two stiffening members 8 are provided, inter alia, to form a pressure safety means for the hydrophone.

The hydrophone is manufactured in the following manner:

The separate members to be used for the construction of the hydrophone according to the invention are manufactured. The piezoelectric crystals are provided with electrodes or poles on both sides by applying a silver coating. Diaphragm wafers in a cylindrical shape are manufactured of beryllium copper (BeCu).

The central portion 6 of the casing is manufactured in two parts, two ring members 7 being first provided of alumina ($Al_2O_3$) with a purity of 96% and with a cross section as shown in FIG. 1. Two spacers 8 are manufactured with the shape as shown in FIG. 1. A through hole 14 is provided in said spacers.

The spacers are manufactured from the same material as the central ring portions 7, i.e. pure alumina. The members 7 and 8 are metalized in the areas depicted with curly lines in FIG. 1.

Then the hydrohone housing is manufactured from brass with frictional fastening plates for the casing 2, as disclosed above.

Each diaphragm wafer 3 is now soldered to an alumina ring 7 via the metalization 11 by compression with temperature increase. When said two parts have been assembled the piezoelectric crystal element is glued to the diaphragm wafer 3 in the central portion by the aid of a conductive silver glue. Here, a very accurate positioning is necessary in order to obtain an equal arrangement of all crystals. The spacer-stiffening member 8 is then secured by glueing in a projection 13 of the central ring 7, as shown in the Figure. The distance from the crystal 4 is thus precisely set.

Figure 2:
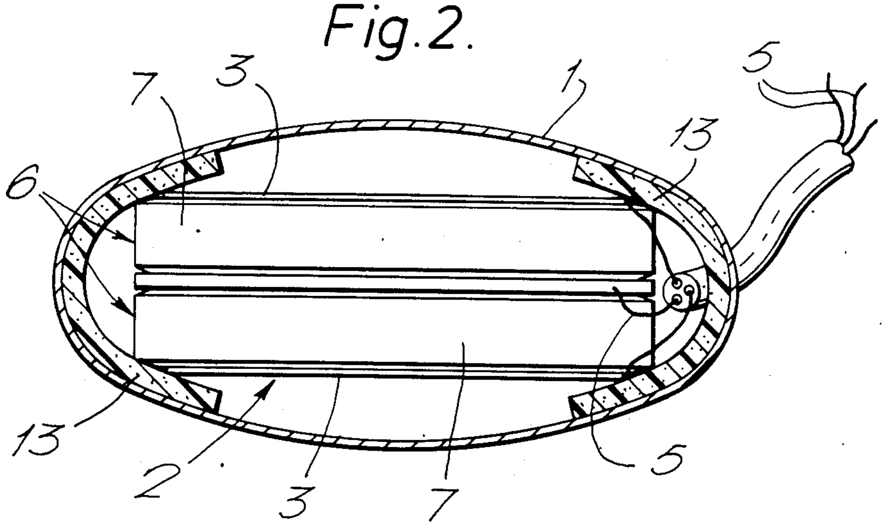
FIG. 2 is a plan view of a hydrophone according to the invention with its protective housing.

The next step of production is to provide a connection from the piezoelectric crystal 4 to the metalization on the stiffening member and the metalization 11 of the central annular portion, respectively. A gold thread is used and is inserted through the hole 14 in the stiffening member 8 and secured to the crystal, e.g. by the aid of an ultrasonic fastening technique. The other part of the gold thread is soldered to one of the two metalization areas in a conventional manner. Then two such "half" hydrophones are assembled into a casing. This is achieved by contacting the two metalized surfaces 11 and soldering the joint from the outside, including heating to make the metalized surfaces fuse together. Conducting wires are then attached to the two diaphragm wafers and the central soldering, and the wires are assembled to a conduit. The casing 2 is then inserted into the housing 1 with frictional fastening. Before said two halves are assembled every single hydrophone element may be tested for checking its quality. Such a testing of each half may also be carried out after the assemblage to the complete hydrophone. The wiring from the interior poles of the piezoelectric crystal will then be joined via the metalization 11 of the central portion and out to the soldering 5 in the center of the ceramic ring, whereas the two diaphragm wafers may be connected by an external wire as indicated in FIG. 1. Alternatively, the wires from the two diaphragm wafers and from the central contact ring may be joined as separate wires in the conductor leading off from the hydrophone. After the functional test the two wires from the diaphragm wafers may be soldered together to one conductor outside the housing 1. Such an approach is indicated in FIG. 2.

As will appear from FIG. 1 there is a space between said two stiffening plates 8. In this space signal amplifying or signal processing electronic elements may be provided. When providing such electronic amplifyer elements or the like in the central hydrophone portion the necessary electric terminals to said elements may be arranged by constructing the central part 6 not only with two annular elements 7, but with three or more such elements which are all provided with a metalizing layer at their mutual contact surfaces, said layers being soldered at the outside.

Numerous modifications are thus possible within the scope of the invention.

What we claim is:

1. An arrangement in a piezoelectric hydrophone having a protective outer housing, in which a waterproof casing is provided comprising two mutually opposed and parallel diaphragm wafers on inner surfaces on which piezoelectric crystals with poles are secured and are coated on their outer surfaces, and where connecting wires extend from the casing through a hollow central portion, and wherein (a) the central portion of the casing comprises at least two joined ceramic elements, extending in a plane parallel with the diaphragm wafers and being provided with a metalization in areas of mutual contact, (b) in the cavity of the two joined ceramic elements respectively, a stiffening ceramic plate is inserted and secured to said two joined ceramic elements by matching projections, and (c) the poles of the piezoelectric crystals facing inward are conductively connected to the metalization in the connecting plane of the two joined ceramic elements with an additional conductive connection from the metalization externally, whereas the poles of the piezoelectric crystals facing outward are joined outside the casing via said diaphragm wafers.

2. An arrangement as claimed in claim 1, wherein $Al_2O_3$ having a degree of purity of more than 85%, preferably approximately 96% is used as a ceramic material.

3. An arrangement as claimed in claim 1, wherein the two joined ceramic elements are rounded at both sides in the joint plane and that the metalization is applied along the rounded portions.

4. An arrangement as claimed in claim 1, wherein the gap formed on the outside by rounded portions of the two joined ceramic elements is filled with a soldering material.

5. An arrangement as stated in claim 1, wherein the ceramic plate has a through hole near its circumference and on the surface averted from the crystal is provided with a metalization that is by the aid of a soldering material electrically connected with an adjacent metalization on the two joined ceramic element.

6. An arrangement as claimed in claim 1, wherein the two joined ceramic elements, the ceramic plate, and the diaphragm wafer are circular.

7. An arrangement as claimed in claim 1, wherein the housing is an elliptical cylinder, holding the case via a lining.

* * * * *